United States Patent [19]

Kang

[11] Patent Number: 5,786,259
[45] Date of Patent: Jul. 28, 1998

[54] METHODS OF FORMING INTEGRATED CIRCUIT CAPACITORS INCLUDING ETCH STOPPING LAYERS

[75] Inventor: Chang-seok Kang, Kyungki-do, Rep. of Korea

[73] Assignee: Samsung Electronics Co., Ltd., Suwon, Rep. of Korea

[21] Appl. No.: 947,946

[22] Filed: Oct. 9, 1997

[30] Foreign Application Priority Data

Apr. 25, 1997 [KR] Rep. of Korea ............... 1997-15531

[51] Int. Cl.$^6$ .................................................. H01L 21/20
[52] U.S. Cl. ........................ 438/396; 438/3; 438/253; 438/240
[58] Field of Search .................... 438/3, 240, 250, 438/393, 396; 257/310

[56] References Cited

U.S. PATENT DOCUMENTS

| | | | |
|---|---|---|---|
| 5,366,920 | 11/1994 | Yamamichi et al. | 438/396 |
| 5,416,042 | 5/1995 | Beach et al. | 438/396 |
| 5,478,772 | 12/1995 | Fazan . | |
| 5,506,166 | 4/1996 | Sandhu et al. | 438/396 |
| 5,670,410 | 9/1997 | Pan | 148/DIG. 14 |

FOREIGN PATENT DOCUMENTS 7-22518  1/1995  Japan .

OTHER PUBLICATIONS

Kuniaki Koyama et al., *A Stacked Capacitor With $(Ba_xSr_{1-x})TiO_3$ For 256M DRAM*, IEDM, 1991, 823–826.

Primary Examiner—Tuan H. Nguyen
Attorney, Agent, or Firm—Myers Bigel Sibley & Sajovec

[57] ABSTRACT

A method of forming a capacitor for an integrated circuit device includes the step of forming a first conductive layer on an integrated circuit substrate wherein the first conductive layer covers a portion of the integrated circuit substrate and wherein a second portion of the integrated circuit substrate is exposed. An etch stopping layer is formed on the first conductive layer, and an insulating layer is formed on the etch stopping layer and on the exposed portion of the integrated circuit substrate. The insulating layer is etched using the etch stopping layer as an etching endpoint so that a portion of the insulating layer on the second portion of the integrated circuit substrate remains adjacent the first conductive layer and so that the etch stopping layer is exposed. The etch stopping layer is removed and a dielectric layer is formed on the first conductive layer. A second conductive layer is formed on the dielectric layer opposite the first conductive layer so that the first conductive layer defines a lower capacitor electrode and the second conductive layer defines an upper capacitor electrode.

31 Claims, 6 Drawing Sheets

METHODS OF FORMING INTEGRATED CIRCUIT CAPACITORS INCLUDING ETCH STOPPING LAYERS

FIELD OF THE INVENTION

The present invention relates to the field of integrated circuits and more particularly to methods of fabricating integrated circuit capacitors.

BACKGROUND OF THE INVENTION

In order to facilitate the fabrication of highly integrated semiconductor devices such as dynamic random access memories (DRAM) and ferroelectric random access memories (FRAM), materials having relatively high dielectric constants have been substituted for conventional dielectric materials in capacitor dielectric layers. For example, PZT (PbZrTiO$_3$) and BST (BaSrTiO$_3$) have been used to provide capacitor dielectric layers. When using these materials, lower capacitor electrodes have been formed from materials such as Pt-group metals and oxides thereof. Because the lower capacitor electrode may react with a polysilicon contact plug therebeneath, conductive barrier layers have been provided to reduce reactions between the lower capacitor electrode and the polysilicon contact plug. For example, a conductive barrier layer is discussed in the article by Koyama et al. entitled "A Stacked Capacitor With (Ba$_x$Sr$_{1-x}$)TiO$_3$ for 256M DRAM," IEDM, 823–826, 1991, the disclosure of which is hereby incorporated herein in its entirety by reference.

FIG. 1 is a cross-sectional view illustrating a capacitor structure for an integrated circuit device according to the prior art. As shown, an insulating layer 3 is formed on a semiconductor substrate 1, and a contact hole through the insulating layer 3 exposes a portion of the substrate 1. A polysilicon contact plug 5 is buried in the contact hole, and a tantalum (Ta) barrier layer 7 is formed on the contact plug 5 and portions of the insulating layer 3. A first capacitor electrode 9 is formed from a layer of Pt on the barrier layer 7. A dielectric layer 11 and a sidewall insulating layer 13 are formed on the lower capacitor electrode 9, and an upper capacitor electrode 15 is formed on the dielectric layer 11 and the sidewall insulator 13.

The barrier layer 7 reduces reaction between the lower capacitor electrode 9 and the contact plug 5. Because the lower capacitor electrode 9 and the barrier layer 7 have exposed sidewalls, the barrier layer 7 may be oxidized when depositing a dielectric layer 11 such as a tantalum oxide (Ta$_2$O$_5$) layer. The resistance between the lower capacitor electrode 9 and the substrate I may thus be increased and the performance of the capacitor structure of FIG. 1 may be reduced.

A second capacitor structure has been discussed in U.S. Pat. No. 5,478,772 to Fazan entitled "Method For Forming A Storage Cell Capacitor Compatible With High Dielectric Constant Materials," the disclosure of which is incorporated herein in its entirety by reference. FIG. 2 is a cross-sectional view illustrating a second capacitor structure according to the prior art. As shown, an insulating layer 23 is formed on the semiconductor substrate 21, and a contact hole is formed in the insulating layer 23 exposing a portion of the semiconductor substrate 21. A silicon plug 25 and a Ta barrier layer 27 are formed in the contact hole. A Pt lower capacitor electrode 29 is formed on the barrier layer 27. Moreover, the dielectric layer can be formed on the lower capacitor electrode 29, and an upper capacitor electrode can be formed on the dielectric layer. As shown, the barrier layer 27 of FIG. 2 is formed in the contact hole, and the barrier layer 7 of FIG. 1 is formed on the insulating layer 3 over the contact hole. Because the barrier layer 27 is buried in the contact hole, sidewalls thereof are not exposed when forming the dielectric layer thereby reducing oxidation of the barrier layer 27.

It may be difficult, however, to form the barrier layer 27 and the contact hole as shown in FIG. 2. In particular, a conductive material may be deposited on the surface of the insulating layer 23 and on the polysilicon plug in the contact hole and a chemical-mechanical-polishing (CMP) or etchback step may be performed on the conductive layer to remove the conductive layer from the surface of the insulating layer 23 while maintaining the conductive layer on the polysilicon plug 25 in the contact hole. In addition, misalignment during the formation of the lower capacitor electrode 29 may leave a portion of the barrier layer 27 exposed so that the exposed portion of the barrier layer 27 may be oxidized when depositing the dielectric layer. As before, oxidation of the barrier layer 27 may increase the resistance between the lower capacitor electrode 29 and the semiconductor substrate 21, thereby reducing the manufacturing yield of the semiconductor device.

A method of burying a conductive layer between barrier layers has been discussed in the Japanese Patent laid open Publication No. 1995-22518, which will be discussed with reference to FIGS. 3 and 4. As shown in FIG. 3, a field oxide layer 43 defines active and isolation regions of the semiconductor substrate 41, and source regions 44 are formed in active regions of the substrate. In addition, an insulating layer 45 and a bit line 47 are formed on the semiconductor substrate 41. A planarizing layer 49 is formed on the insulating layer 45, and contact holes are formed through the planarizing layer 49 and the insulating layer 45 thereby exposing portions of the source regions 44. Contact plugs are formed in each of the contact holes and each of the contact plugs includes a connecting conductor 51 and an adhesion layer 53. A patterned insulating layer 55 is formed on the planarization layer 49, and a first conductive Pt layer 57 is formed on the patterned insulating layer 55 and the planarization layer 49.

As shown in FIG. 4, the first conductive layer 57 is selectively etched using a chemical-mechanical-polishing (CMP) step to provide the lower capacitor electrodes 57a between the portions of the patterned insulating layer 55. Because the conductive Pt layer 57 is subjected to the chemical-mechanical-polishing step, scratches may be formed on the conductive Pt layer as a result of polishing agents used in the CMP step, thereby increasing the roughness of the resulting lower capacitor electrodes 57a thereby deteriorating the performance thereof. In addition, residues may remain on the lower capacitor electrodes 57a after performing the CMP step. The interface between the lower capacitor electrode 57a and a dielectric layer formed thereon may be deteriorated, thereby degrading the electrical characteristics of a capacitor including the structure.

SUMMARY OF THE INVENTION

It is therefore an object of the present invention to provide improved methods of forming capacitors for integrated circuit devices.

It is another object of the present invention to provide reduced resistance between a lower capacitor electrode and an integrated circuit substrate.

It is still another object of the present invention to reduce oxidation of a barrier layer of an integrated circuit capacitor.

It is yet another object of the present invention to improve an interface between a lower electrode and a dielectric layer of an integrated circuit capacitor.

These and other objects are provided according to the present invention by a method including the steps of forming a first conductive layer on an integrated circuit substrate wherein the first conductive layer covers a first portion of the integrated circuit substrate and wherein a second portion of the integrated circuit substrate is exposed, and forming an etch stopping layer on the first conductive layer. An insulating layer is formed on the etch stopping layer opposite the first portion of the integrated circuit substrate and on the second portion of the integrated circuit substrate. The insulating layer is etched using the etching stopping layer as an etching endpoint so that a portion of the insulating layer on the second portion of the integrated circuit substrate remains adjacent the first conductive layer and so that the etch stopping layer is exposed. The etch stopping layer is removed, and a dielectric layer is formed on the first conductive layer and a second conductive layer is formed on the dielectric layer opposite the first conductive layer.

The first conductive layer is thus protected by the etch stopping layer during the step of etching the insulating layer, thereby improving the interface between the first conductive layer and the dielectric layer. The insulating layer can include a material such as silicon oxide, undoped silicate glass, spin-on-glass, or borophosphosilicate glass. The etch stopping layer can include the materials such as silicon nitride, titanium nitride, or boron nitride, and the etch stopping layer can have a thickness in the range of 100 Angstroms to 5000 Angstroms.

The method can also include the step of forming an adhesion layer between the first conductive layer and the etch stopping layer, thereby improving adhesion therebetween. This adhesion layer can include a material such as titanium, titanium silicon nitride, tantalum silicon nitride, tantalum aluminum nitride, or titanium nitride. The etching step can include a chemical-mechanical-polishing step or an etch-back step. Moreover, the etching step can include etching the insulating layer so that the remaining portion of the insulating layer on the second portion of the integrated circuit substrate is recessed below a surface of the first conductive layer.

The dielectric layer can include a material such as $Ta_2O_5$, $SiO_2$, $SrTiO_3$, $(Ba, Sr)TiO_3$, $PbZrTiO_3$, $SrBi_2Ta_2O_9$, $(Pb, La)(Zr, Ti)O_3$, or $Bi_4Ti_3O_{12}$. Because the integrated circuit substrate is covered by the remaining portions of the insulating layer and the first conductive layer, reactions between portions of the integrated circuit substrate and the dielectric layer can be reduced. In particular, oxidation of portions of the integrated circuit substrate can be reduced.

Each of the first and second conductive layers can include a material such as a Pt-group metal, an oxide of a Pt-group metal, a refractory metal, or an oxide of a refractory metal. More particularly, an oxide of a Pt-group metal can include $IrO_2$, $RuO_2$, or $OsO_2$, and a refractory metal can include W, TiN, TiW, or WN.

In addition, the step of forming the first conductive layer can be preceded by the step of forming a second insulating layer on the integrated circuit substrate wherein the second insulating layer has a contact hole therein exposing a portion of the integrated circuit substrate. A contact plug can be formed in the contact hole so that the first conductive layer can be electrically coupled to the integrated circuit substrate. The resulting capacitor can thus be used as a memory cell capacitor for a DRAM or a FRAM wherein the first conductive layer is electrically coupled to a memory cell access transistor formed in the integrated circuit substrate.

A barrier layer can also be formed between the first conductive layer and the first portion of the integrated circuit substrate. This barrier layer can be used to reduce reaction between the first conductive layer and a contact plug formed in the integrated circuit substrate. Furthermore, oxidation of this barrier layer during the step of forming the dielectric layer can be reduced because the barrier layer is covered by the first conductive layer and the remaining portions of the insulating layer.

According to the methods of the present invention, an etch stopping layer can be used to define the etching endpoint when etching the insulating layer, thereby protecting the first conductive layer during the etching step. Accordingly, the interface between the first conductive layer and the dielectric layer can be improved, thereby improving the performance of the resulting capacitor.

DETAILED DESCRIPTION

Figure 1:
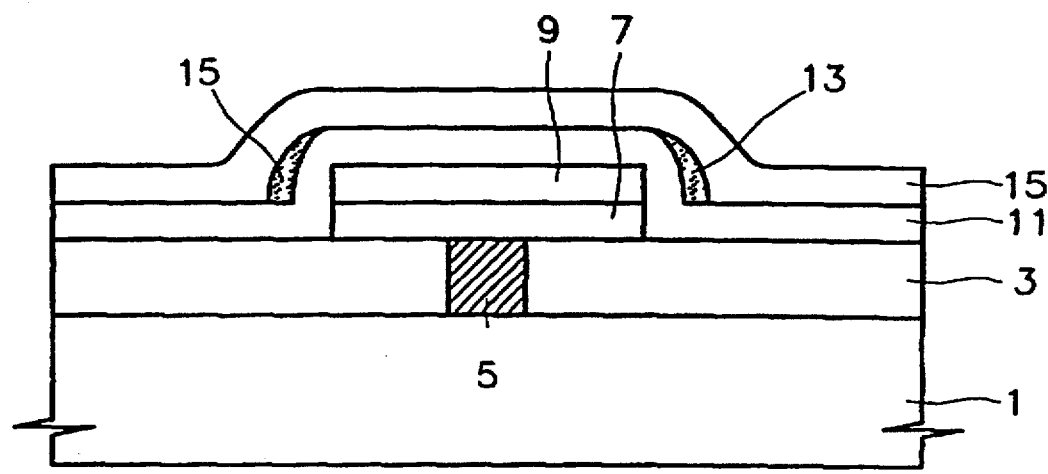
FIG. 1 is a cross-sectional view illustrating a first capacitor structure according to the prior art.
Figure 2:
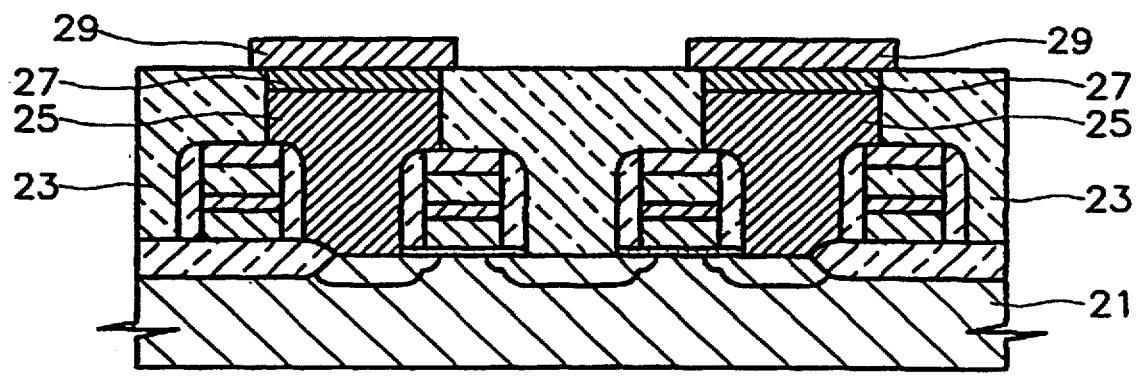
FIG. 2 is a cross-sectional view illustrating a second capacitor structure according to the prior art.
Figure 3:
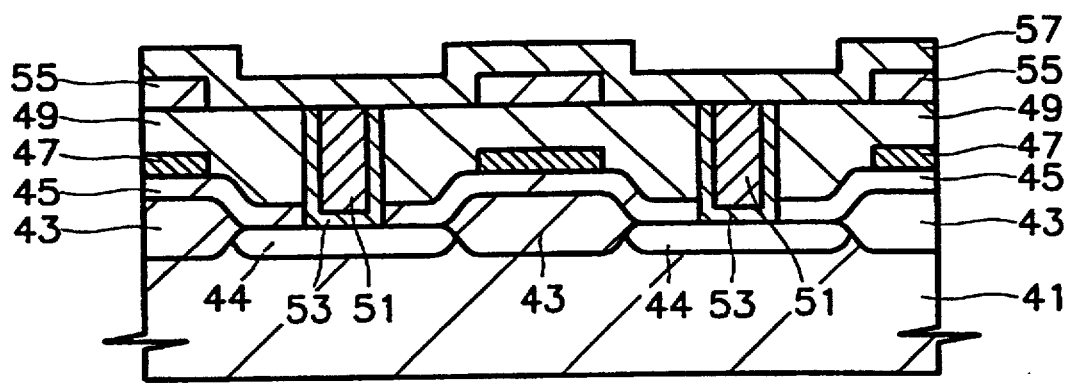
FIGS. 3 and 4 are cross-sectional views illustrating steps of a method of fabricating a third capacitor structure according to the prior art.
Figure 4:
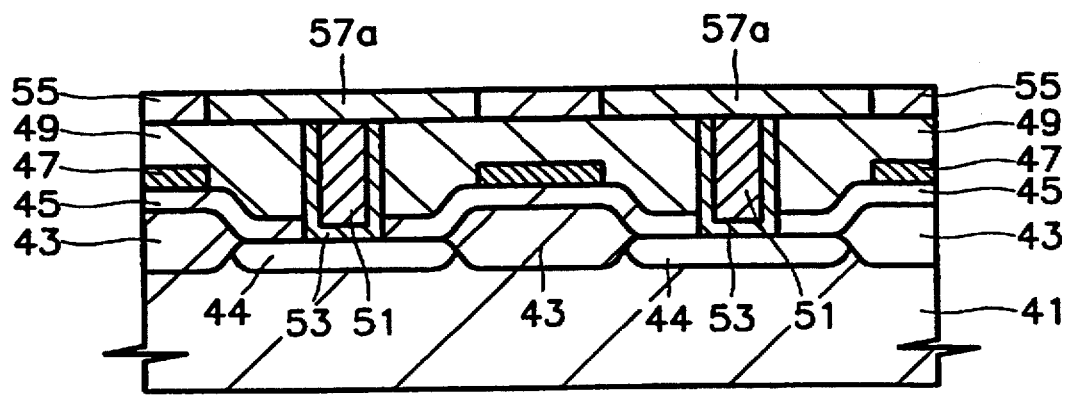

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 5:
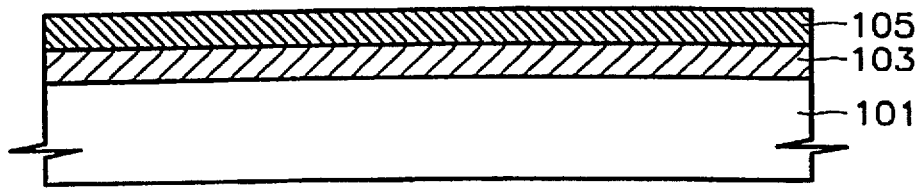
FIGS. 5–9 are cross-sectional views illustrating steps of a first method of fabricating a capacitor according to the present invention.

FIGS. 5 through 9 are cross-sectional views illustrating steps of a method of fabricating a capacitor for an integrated circuit device according to the present invention. As shown in FIG. 5, a first conductive layer 103 having a thickness in the range of 100 Angstroms to 5000 Angstroms is formed on a semiconductor substrate 101. The first conductive layer 103 can be a layer of a Pt-group metal such as Pt, Ru, Ir, or Os; an oxide of a Pt-group metal such as $IrO_2$, $RuO_2$, or $OsO_2$; a refractory metal such as W, TiN, TiSiN, TaSiN, TaAlN, or WN; or an oxide of a refractory metal. An etch stopping layer 105 having a thickness in the range of 100 Angstroms to 1000 Angstroms is formed on the first conductive layer 103. The etch stopping layer 105 has a relatively high etching selectivity with respect to the first conductive layer 103 and an insulating layer discussed below with regard to FIGS. 7 and 8. For example, the etch stopping layer 105 can be a layer of SiN, TiN, or BN. In addition, an adhesion layer can be formed between the first conductive layer 103 and the etch stopping layer 105 to improve adhesion between the first conductive layer 103 and the etch stopping layer 105. The adhesion layer can be a layer of a material such as Ti, TiSiN, TaSiN, TaAlN, or TiN.

Figure 6:
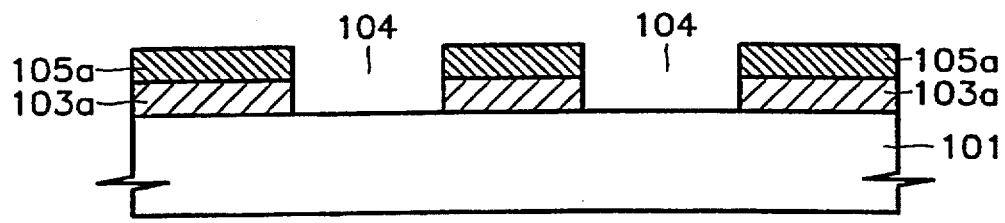
Figure 7:
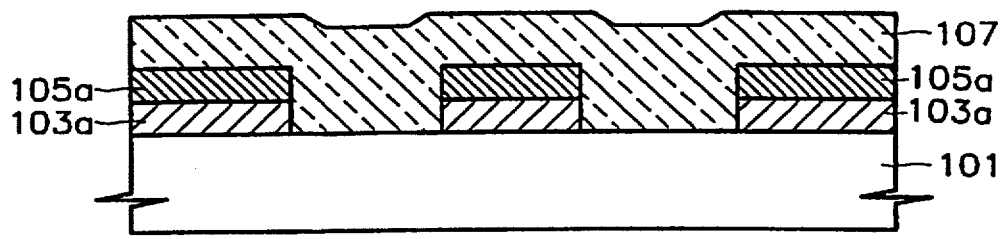

The etch stopping layer 105 and the first conductive layer 103 are then patterned as shown in FIG. 6 to form the lower capacitor electrodes 103a and the patterned etch stopping layers 105a thereon. As shown, portions of the substrate 101 are exposed by the contact holes 104 between the lower capacitor electrodes 103a. An insulating layer 107 is formed on the patterned etch stopping layers 105a and on the exposed portions of the substrate 101 as shown in FIG. 7. The insulating layer 107 can be a layer of silicon oxide, undoped silicate glass (USG), spin-on-glass (SOG), or borophosphosilicate glass (BPSG).

Figure 8:
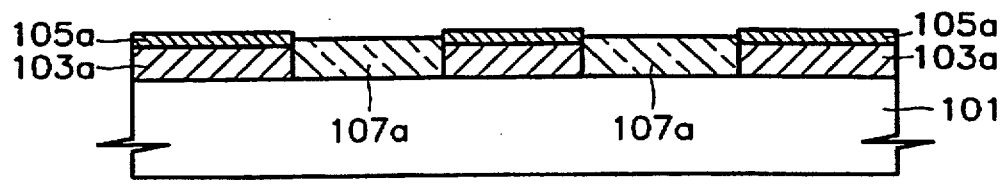
Figure 9:
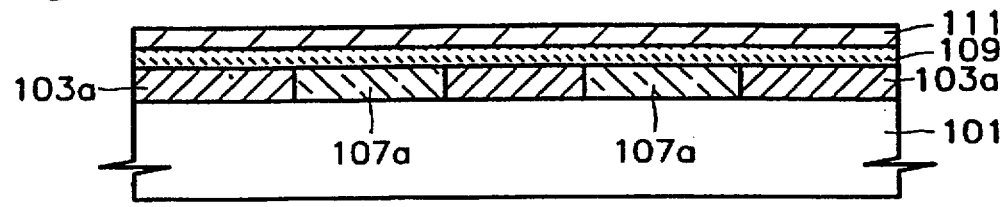

The insulating layer 107 is etched using a chemical-mechanical-polishing (CMP) step or an etch-back step wherein the patterned etch stopping layer 105a determines an etching endpoint as shown in FIG. 8. After the etching step, portions of the insulating layer 107a remain on the substrate 101 between the lower capacitor electrodes, and the patterned etch stopping layer 105a is exposed. The patterned etch stopping layer 105a is then removed as shown in FIG. 9. A dielectric layer 109 and a second conductive layer 111 are then formed on the lower capacitor electrodes 103a and the remaining portions of the insulating layer 107a. The dielectric layer 109 can be a layer of a material such as $Ta_2O_5$, $SiO_2$, $SrTiO_3$, $(Ba, Sr)TiO_3$, $PbZrTiO_3$, $SrBi_2Ta_2O_9$, $(Pb, La)(Zr, Ti)O_3$, or $Bi_4Ti_3O_{12}$. The second conductive layer 111 can be a layer of a Pt-group metal such as Pt, Ru, Ir, or Os; an oxide of a Pt-group metal such as $IrO_2$, $RuO_2$, or $OsO_2$; a refractory metal such as W, TiN, TiSiN, TaSiN, TaAln, or WN; or an oxide of a refractory metal.

Figure 10:
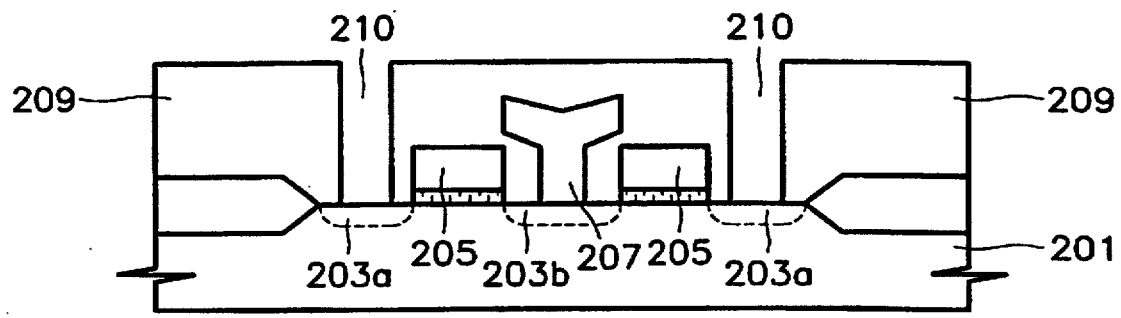
FIGS. 10–17 are cross-sectional views illustrating steps of a second method of fabricating a capacitor according to the present invention.

FIGS. 10 through 17 are cross-sectional views illustrating steps of a second method for fabricating a capacitor for an integrated circuit device according to the present invention. As shown in FIG. 10, memory cell access transistors including source regions 203a, drain regions 203b, and gate electrodes 205 are formed on a semiconductor substrate 201. A bit line 207 is formed in contact with the drain region 203b, and an insulating layer 209 is formed on the resulting structure. The insulating layer 209 is selectively etched using photolithography and etch steps to form the contact holes 210 exposing portions of the source regions 203a.

Figure 11:
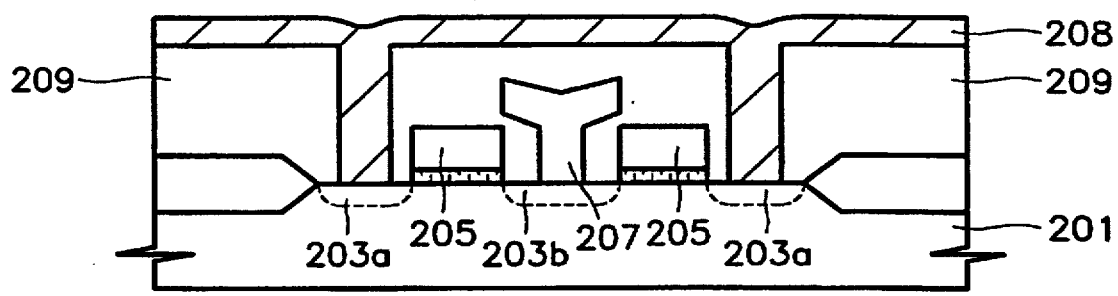
Figure 12:
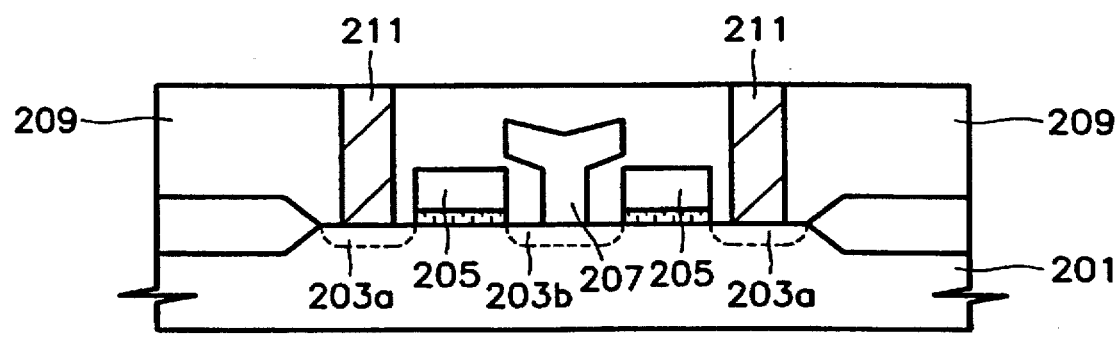
Figure 13:
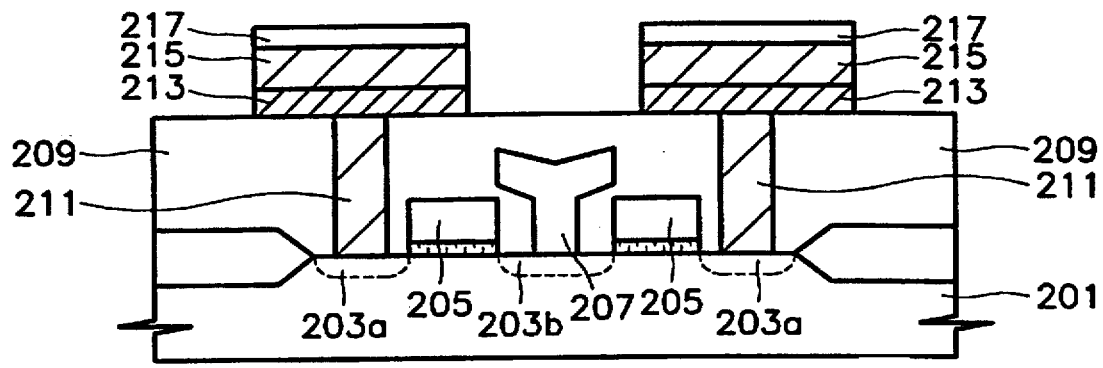

A conductive layer 208 is formed on the insulating layer 209 including the contact holes 210 as shown in FIG. 11. This conductive layer 208 can be a layer of a refractory metal, polysilicon, a Pt-group metal, or a metal silicide. The conductive layer 208 can also be a combination of two or more of the above-mentioned materials. The conductive layer 208 is then etched using an etch-back step or a chemical-mechanical-polishing (CMP) step to provide the contact plugs 211 in the contact holes 210 as shown in FIG. 12.

A barrier layer, a first conductive layer, and an etch stopping layer are formed across the insulating layer 209 and the contact plugs 211. These layers are then patterned using photolithography and etch steps to provide the barrier layers 213, the lower capacitor electrodes 215, and the etch stopping layers 217 thereby exposing portions of the insulating layer 209. In addition, an adhesion layer can be formed between the first conductive layer and the etch stopping layer to improve adhesion between the two. The adhesion layer can be a layer of Ti, TiSiN, TaSiN, TaAlN, or TiN.

The barrier layer 213 can be made up of materials such as a conductive oxide, a refractory metal, a Pt-group metal, a refractory metallic silicide, a refractory metallic nitride, or combinations thereof. More particularly, the barrier layer can be made up of a material such as Ti, W, Ir, Ru, $TiSi_x$, $WSi_x$, TiSiN, TaSiN, $IrO_2$, $RuO_2$, WN, TiN, TaAlN, or combinations thereof. The first conductive layer can be made up of a Pt-group metal such as Pt, Ru, Ir, or Os; an oxide of a Pt-group metal such as $IrO_2$, $RuO_2$, or $OsO_2$; a refractory metal such as W, TiN, TiW, TiSiN, TaSiN, TaAlN, or WN; or an oxide of a refractory metal. Alternately, the conductive layer can include multiple layers of the above-mentioned materials.

Figure 14:
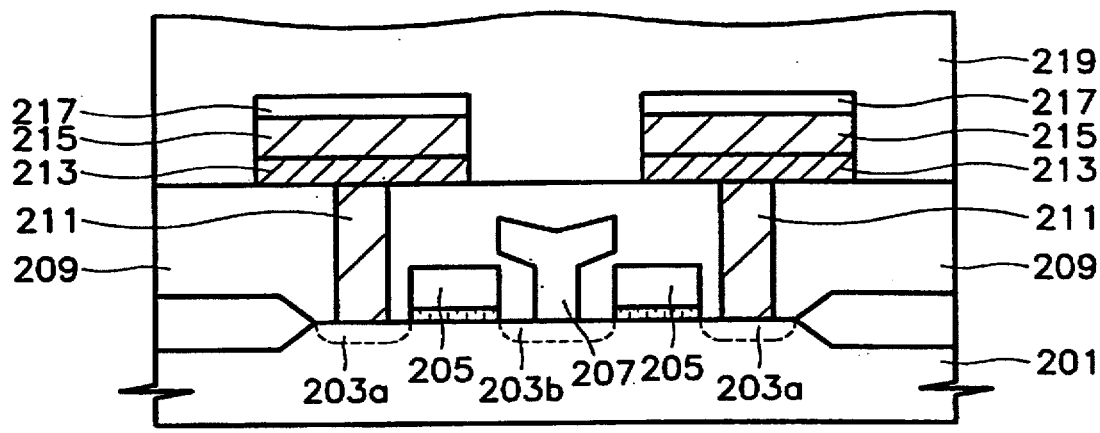
Figure 15:
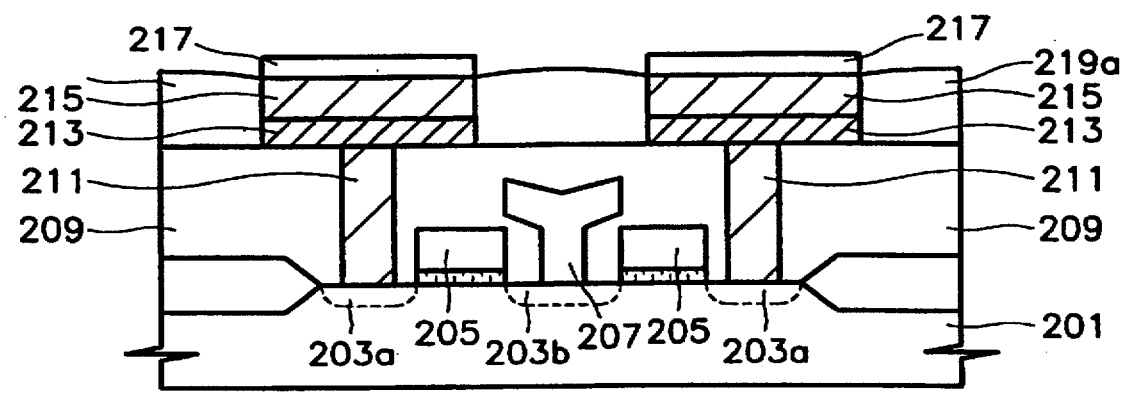

The etch stopping layer is preferably a layer of a material having a relatively high etching selectivity with respect to the second insulating layer 219 shown in FIGS. 14 and 15. For example, the etch stopping layer can include a layer of SiN, TiN, or BN. The etch stopping layer can thus protect the lower capacitor electrode 215 when performing a CMP or etch-back step. In particular, a SiN etch stopping layer 217 can be formed having a thickness in the range of 100 Angstroms to 5000 Angstroms.

A second insulating layer 219 having a thickness in the range of 1000 Angstroms to 5000 Angstroms is formed on the etch stopping layer 217 and the exposed portions of the insulating layer 209 as shown in FIG. 14. The second insulating layer 219 fills the spaces between the lower capacitor electrodes 215. The second insulating layer 219 can include a layer of silicon oxide, undoped silicate glass (USG), spin-on-glass (SOG), or borophosphosilicate glass (BPSG).

The second insulating layer 219 is etched using a CMP step or an etch-back step as shown in FIG. 15. In particular, the etch stopping layer 217 is used as an etching endpoint during the etch step. Accordingly, portions of the insulating layer 219a remain between the lower capacitor electrodes 215 thereby exposing the etch stopping layers 217. Accordingly, damage of the lower capacitor electrodes 215 is reduced during the etching step as a result of the protection provided by the etch stopping layers 217. Process margins can thus be increased. In addition, the interface characteristics between the lower capacitor electrodes and a subsequently formed capacitor dielectric layer can be improved. The electrical characteristics of the resulting capacitor can thus be enhanced.

Figure 16:
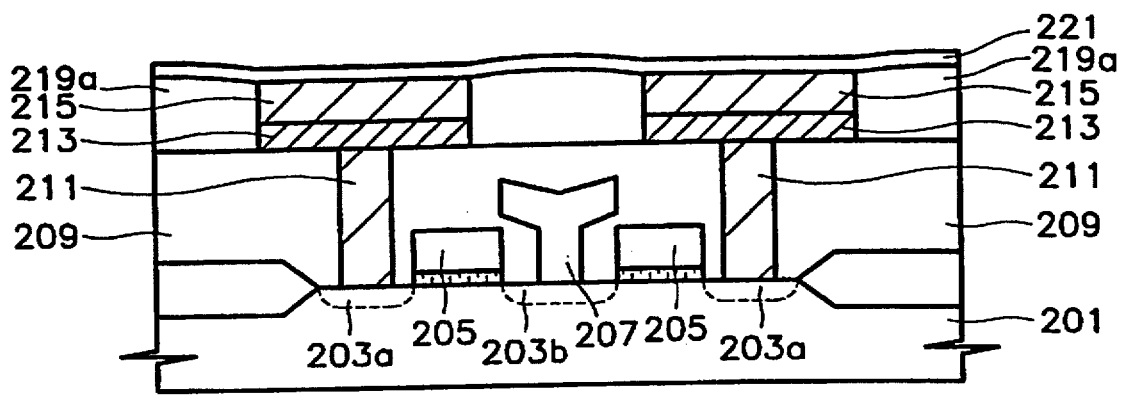

The etch stopping layers 217 can then be removed by a wet etching step using a phosphoric acid solution. A dielectric layer 221 is then formed on the remaining portions of the insulating layer 219a and on the lower capacitor electrodes 215 as shown in FIG. 16. The dielectric layer 221 can include a layer of a material such as $Ta_2O_5$, $SiO_2$, $SrTiO_3$, $(Ba, Sr)TiO_3$, $PbZrTiO_3$, $SrBi_2Ta_2O_9(Pb,La)$ $(Zr, Ti)O_3$, or $Bi_4Ti_3O_{12}$, or combinations thereof. The dielectric layer 221 can be formed by sputtering or by chemical vapor deposition (CVD).

Figure 17:
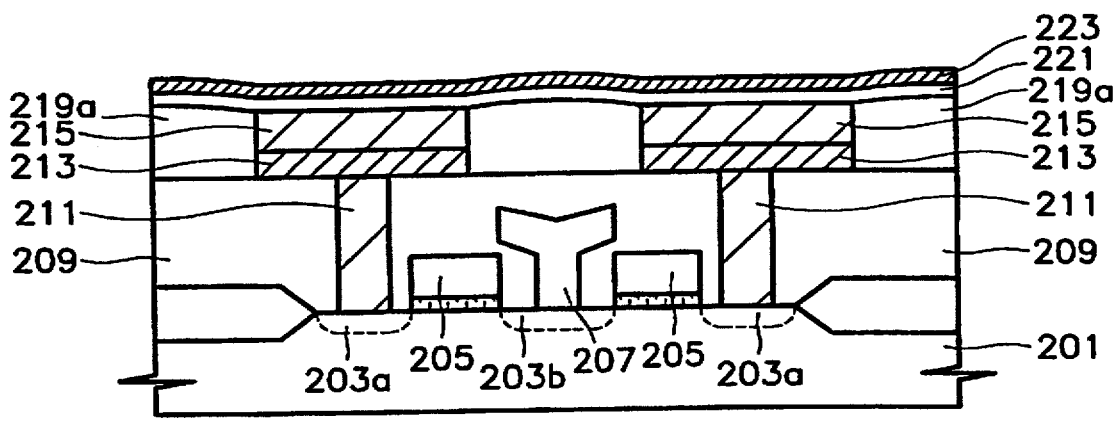

A second conductive layer 223 is then formed on the dielectric layer 221 as shown in FIG. 17 thereby providing an upper capacitor electrode opposite each of the lower capacitor electrodes 215. The second conductive layer 223 can include a layer of a material such as a Pt-group metal such as Pt, Ru, Ir, or Os; an oxide of a Pt-group metal such as $IrO_2$, $RuO_2$, or $OsO_2$; a refractory metal such as W, TiN, TiSiN, TaSiN, TaAlN, or WN; an oxide of a refractory metal; or combinations thereof.

Figure 18:
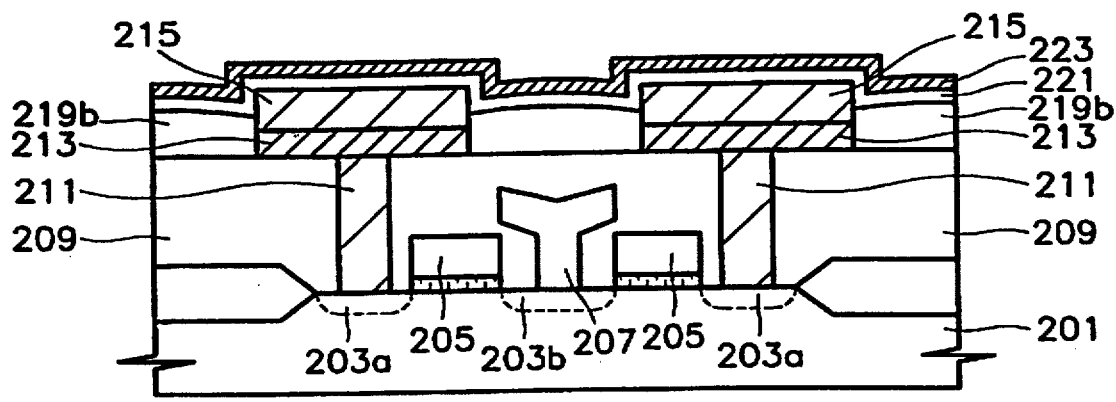
FIG. 18 is a cross-sectional view illustrating a step of a third method of fabricating a capacitor according to the present invention.

FIG. 18 is a cross-sectional view illustrating a step of a third method of forming a capacitor for an integrated circuit device according to the present invention. In FIG. 18, like numbers are used to designate like or equivalent portions thereof illustrated in FIGS. 10 through 17. Moreover, the steps illustrated in FIGS. 10 through 15 were performed prior to the step illustrated in FIG. 18. The remaining portions of the second insulating layer 219a were then subjected to a further etch so that the insulating layer portions 219b are recessed below the surfaces of the lower capacitor electrodes 215. The etch stopping layers 217 are then removed by a wet etching step using a phosphoric acid solution, and the dielectric layer 221 and the second conductive layer 223 are formed as shown in FIG. 18. Accordingly, the second conductive layer 223 provides an upper capacitor electrode opposite each of the lower capacitor electrodes 215.

As discussed above, an etch stopping layer is formed on each of the lower capacitor electrodes and an insulating layer formed thereon is etched using the etch stopping layer to set an etching endpoint. Accordingly, damage to and/or consumption of the lower capacitor electrodes during the step of etching the insulating layer can be reduced. Furthermore, oxidation of the barrier layer can be reduced because the barrier layer is not exposed when forming the dielectric layer. Accordingly, resistance between the lower capacitor electrode and the substrate can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a capacitor for an integrated circuit device, said method comprising the steps of:
    forming a first conductive layer on an integrated circuit substrate wherein said first conductive layer covers a first portion of said integrated circuit substrate and wherein a second portion of said integrated circuit substrate is exposed;
    forming an etch stopping layer on said first conductive layer;
    forming an insulating layer on said etch stopping layer opposite said first portion of said integrated circuit substrate and on said second portion of said integrated circuit substrate;
    etching said insulating layer using the etch stopping layer as an etching endpoint so that a portion of said insulating layer on said second portion of said integrated circuit substrate remains adjacent said first conductive layer and so that said etch stopping layer is exposed;
    removing said etch stopping layer;
    forming a dielectric layer on said first conductive layer; and
    forming a second conductive layer on said dielectric layer opposite said first conductive layer.

2. A method according to claim 1 wherein said insulating layer comprises a material chosen from the group consisting of silicon oxide, undoped silicate glass (USG), Spin-On-Glass (SOG), and borophosphosilicate glass (BPSG).

3. A method according to claim 1 wherein said etch stopping layer comprises a material chosen from the group consisting of silicon nitride (SiN), titanium nitride (TiN), and boron nitride (BN).

4. A method according to claim 1 wherein said etch stopping layer has a thickness in the range of 100 Angstroms to 5000 Angstroms.

5. A method according to claim 1 further comprising the steps of:
    forming an adhesion layer between said first conductive layer and said etch stopping layer.

6. A method according to claim 5 wherein said adhesion layer comprises a material chosen from the group consisting of titanium (Ti), titanium silicon nitride (TiSiN), tantalum silicon nitride (TaSiN), tantalum aluminum nitride (TaAlN), and titanium nitride (TiN).

7. A method according to claim 1 wherein said etching step comprises a chemical-mechanical-polishing (CMP) step or an etch-back step.

8. A method according to claim 1 wherein said etching step comprises etching said insulating layer so that said remaining portion of said insulating layer on said second portion of said integrated circuit substrate is recessed below a surface of said first conductive layer.

9. A method according to claim 1 wherein said dielectric layer comprises a material chosen from the group consisting of $Ta_2O_5$, $SiO_2$, $SrTiO_3$, $(Ba, Sr)TiO_3$, $PbZrTiO_3$, $SrBi_2Ta_2O_9$, $(Pb, La)(Zr, Ti)O_3$, and $Bi_4Ti_3O_{12}$.

10. A method according to claim 1 wherein each of said first and second conductive layers comprises a material chosen from the group consisting of a Pt-group metal, an oxide of a Pt-group metal, a refractory metal, and an oxide of a refractory metal.

11. A method according to claim 10 wherein said oxide of said Pt-group metal comprises an oxide chosen from the group consisting of $IrO_2$, $RuO_2$, and $OsO_2$.

12. A method according to claim 10 wherein said refractory metal is chosen from the group consisting of W, TiN, TiW, and WN.

13. A method according to claim 1 wherein said step of forming said first conductive layer is preceded by the steps of:
    forming a second insulating layer on said integrated circuit substrate wherein said second insulating layer has a contact hole therein exposing a portion of said integrated circuit substrate and wherein said first conductive layer is formed on said contact hole; and
    forming a contact plug in said contact hole so that said first conductive layer is electrically coupled to said integrated circuit substrate.

14. A method according to claim 1 wherein said step of forming said first conductive layer is preceded by the step of:
    forming a barrier layer between said first conductive layer and said first portion of said integrated circuit substrate.

15. A method according to claim 1 wherein said integrated circuit substrate comprises a semiconductor substrate.

16. A method of forming a capacitor for an integrated circuit device, said method comprising the steps of:
    forming a first insulating layer on an integrated circuit substrate wherein said first insulating layer has a contact hole therein exposing a portion of said integrated circuit substrate;
    forming a contact plug in said contact hole;
    forming a first conductive layer on said first insulating layer and on said contact plug wherein said first conductive layer covers a first portion of said first insulating layer, wherein a second portion of said first insulating layer is exposed, and wherein said first conductive layer is electrically coupled to said integrated circuit substrate through said contact plug;
    forming an etch stopping layer on said first conductive layer;
    forming a second insulating layer on said etch stopping layer opposite said first portion of said first insulating layer and on said second portion of said first insulating layer;

etching said second insulating layer using the etch stopping layer as an etching endpoint so that a portion of said second insulating layer on said second portion of said first insulating layer remains adjacent said first conductive layer and so that said etch stopping layer is exposed;

removing said etch stopping layer;

forming a dielectric layer on said first conductive layer; and forming a second conductive layer on said dielectric layer opposite said first conductive layer.

17. A method according to claim 16 further comprising the step of:

forming a barrier layer between said contact plug and said first conductive layer.

18. A method according to claim 17 wherein said barrier layer comprises a material chosen from the group consisting of a conductive oxide, a refractory metal, a Pt-group metal, a refractory metal silicide, and a refractory metal nitride.

19. A method according to claim 17 wherein said barrier layer comprises a material chosen from the group consisting of Ti, W, Ir, Ru, TiSi$_x$, Wsi, TiSiN, TaSiN, IrO$_2$, RuO$_2$, WN, and TiN.

20. A method according to claim 16 wherein said second insulating layer comprises a material chosen from the group consisting of silicon oxide, undoped silicate glass (USG), Spin-On-Glass (SOG), and borophosphosilicate glass (BPSG).

21. A method according to claim 16 wherein said etch stopping layer comprises a material chosen from the group consisting of silicon nitride (SiN), titanium nitride (TiN), and boron nitride (BN).

22. A method according to claim 16 wherein said etch stopping layer has a thickness in the range of 100 Angstroms to 5000 Angstroms.

23. A method according to claim 16 further comprising the steps of:

forming an adhesion layer between said first conductive layer and said etch stopping layer.

24. A method according to claim 23 wherein said adhesion layer comprises a material chosen from the group consisting of titanium (Ti), titanium silicon nitride (TiSiN), tantalum silicon nitride (TaSiN), tantalum aluminum nitride (TaAlN), and titanium nitride (TiN).

25. A method according to claim 16 wherein said etching step comprises a chemical-mechanical-polishing (CMP) step or an etch-back step.

26. A method according to claim 16 wherein said etching step comprises etching said second insulating layer so that said remaining portion of said second insulating layer on said second portion of said first insulating layer is recessed below a surface of said first conductive layer.

27. A method according to claim 16 wherein said dielectric layer comprises a material chosen from the group consisting of Ta$_2$O$_5$, SiO$_2$, SrTiO$_3$, (Ba, Sr)TiO$_3$, PbZrTiO$_3$, SrBi$_2$Ta$_2$O$_9$, (Pb, La)(Zr, Ti)O$_3$, and Bi$_4$Ti$_3$O$_{12}$.

28. A method according to claim 16 wherein each of said first and second conductive layers comprises a material chosen from the group consisting of a Pt-group metal, an oxide of a Pt-group metal, a refractory metal, and an oxide of a refractory metal.

29. A method according to claim 28 wherein said oxide of said Pt-group metal comprises an oxide chosen from the group consisting of IrO$_2$, RuO$_2$, and OsO$_2$.

30. A method according to claim 28 wherein said refractory metal is chosen from the group consisting of W, TiN, TiW, and WN.

31. A method according to claim 16 wherein said contact plug comprises a material chosen from the group consisting of a refractory metal, polysilicon, a Pt-group metal, and a metallic silicide.

* * * * *